United States Patent [19]

Kyomasu et al.

[11] Patent Number: 4,617,649
[45] Date of Patent: Oct. 14, 1986

[54] ERASABLE FPLA

[75] Inventors: Mikio Kyomasu; Toshiyuki Araki, both of Toyono; Shinobu Fukunaga, Kawanishi; Masahiro Shindo, Toyonaka, all of Japan

[73] Assignee: Ricoh Company, Ltd., Tokyo, Japan

[21] Appl. No.: 689,703

[22] Filed: Jan. 7, 1985

Related U.S. Application Data

[63] Continuation of Ser. No. 442,167, Nov. 16, 1982, Pat. No. 4,503,520.

[30] Foreign Application Priority Data

Nov. 17, 1981 [JP]  Japan .................................. 56-185037

[51] Int. Cl.$^4$ ............................................. G11C 13/00
[52] U.S. Cl. ..................................... 365/189; 365/104
[58] Field of Search ................ 365/177, 104, 174, 189

[56] References Cited

U.S. PATENT DOCUMENTS

| | | | |
|---|---|---|---|
| 4,124,899 | 11/1978 | Birkner | 365/189 |
| 4,276,616 | 7/1981 | Hennig | 365/174 |
| 4,503,520 | 5/1985 | Kyoynasu et al. | 365/177 |

Primary Examiner—Terrell W. Fears
Attorney, Agent, or Firm—Oblon, Fisher, Spivak, McClelland & Maier

[57] ABSTRACT

An erasable field programmable logic array including a matrix of reprogrammable memory elements which may be selectively programmed to store a desired logic function therein is provided. Since use is made of reprogrammable memory elements, the stored logic function may be erased and another logic function may be programmed into the programmable logic array.

34 Claims, 12 Drawing Figures

ERASABLE FPLA

This is a continuation of application Ser. No. 442,167, filed Nov. 16, 1982, now U.S. Pat. No. 4,503,520.

BACKGROUND OF THE INVENTION

1. Field of the Invention

This invention generally relates to a semiconductor device and in particular to a programmable logic array (hereinafter also referred to as "PLA"). More specifically, the present invention relates to an erasable field programmable logic array (erasable FPLA) including an array of memory cells which may be selectively programmed to store or unprogrammed to erase a combinational logic whether it is sequential or not.

2. Description of the Prior Art

The programmable logic array (PLA) is well known in the art, and it is a structure that has all the generality of a memory for implementing combinational logic functions. A PLA is becoming more popular because it can be far more compact than a ROM implementation for the same logic function if the PLA layout is appropriately determined.

A programmable logic array or field programmable logic array is a logic array including an array of logic gates whose internal connections may be programmed by the end user. That is, a typical PLA or FPLA includes a matrix of conducting paths and alterable memory elements, such as fusible links, diodes and bipolar transistors, each disposed at the intersections of the conducting paths. Thus, these memory elements may be selectively programmed to possess either one of the binary data thereby forming a desired logic circuit using appropriate gates such as AND, OR, NAND, NOR, etc. However, prior art PLAs or FPLAs are limited in that once the memory elements have been programmed, they can not be altered because programming is carried out by altering the state of the selected memory elements permanently.

SUMMARY OF THE INVENTION

The disadvantages of the prior art are overcome with the present invention and an improved programmable logic array is provided.

It is a general object of the present invention to provide an improved field programmable logic array which may be programmed or unprogrammed repetitively.

Another object of the present inveniton is to provide an erasable field programmable logic array including an array of semi-permanently alterable memory elements.

A further object of the present invention is to provide an erasable FPLA which may be operated at high speed.

A still further object of the present invention is to provide a semiconductor device including an array of semi-permanently alterable memory elements which may be programmed to carry out an arbitrary logic function.

A still further object of the present invention is to provide a semi-permanently alterable memory cell which may be advantageously employed in a PLA.

Other objects, advantages and novel features of the present invention will become apparent from the following detailed description of the invention when considered in conjunction with the accompanying drawings.

BRIEF DESCRIPTION OF THE DRAWINGS

FIG. 5b is a logic circuit diagram which is equivalent in function to what is programmed in the FPLA of FIG. 5a;

DESCRIPTION OF THE PREFERRED EMBODIMENTS

Figure 1:
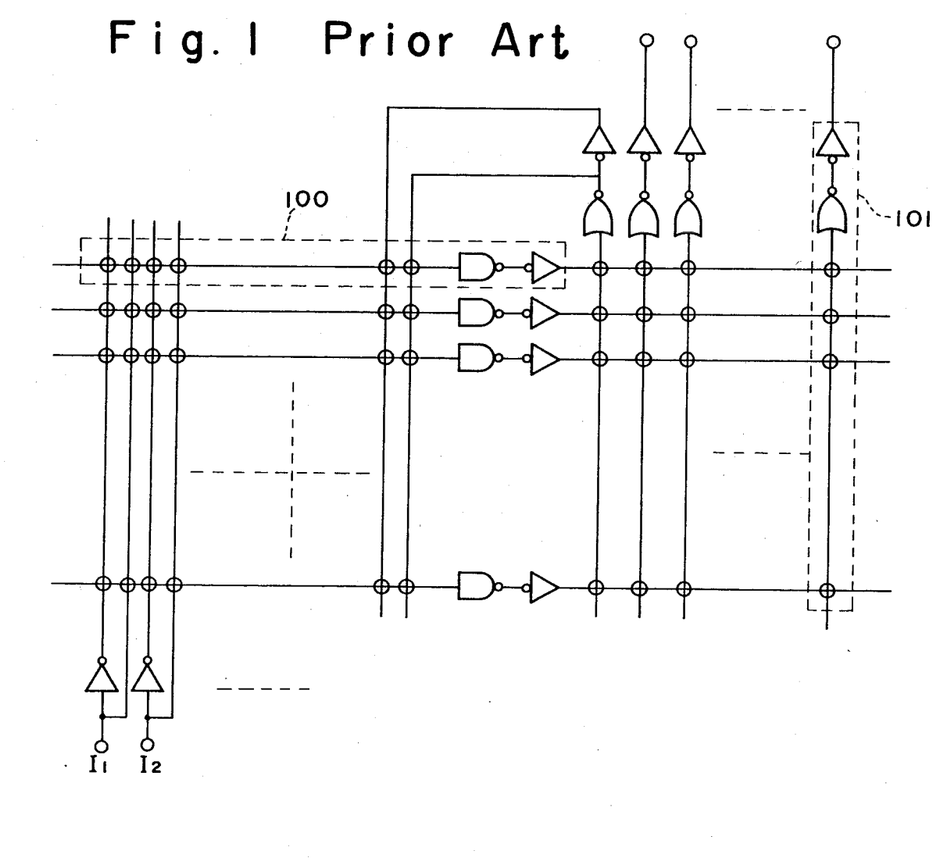
FIG. 1 is a schematic illustration showing the structure of a typical PLA.

As shown in FIG. 1, a PLA comprises an AND-plane including a first plurality of AND gates 100 and an OR-plane including a second plurality of OR gates 101, and custamarily use has been made of multi-emitter transistors and the like to form the AND gate 100.

Figure 2:
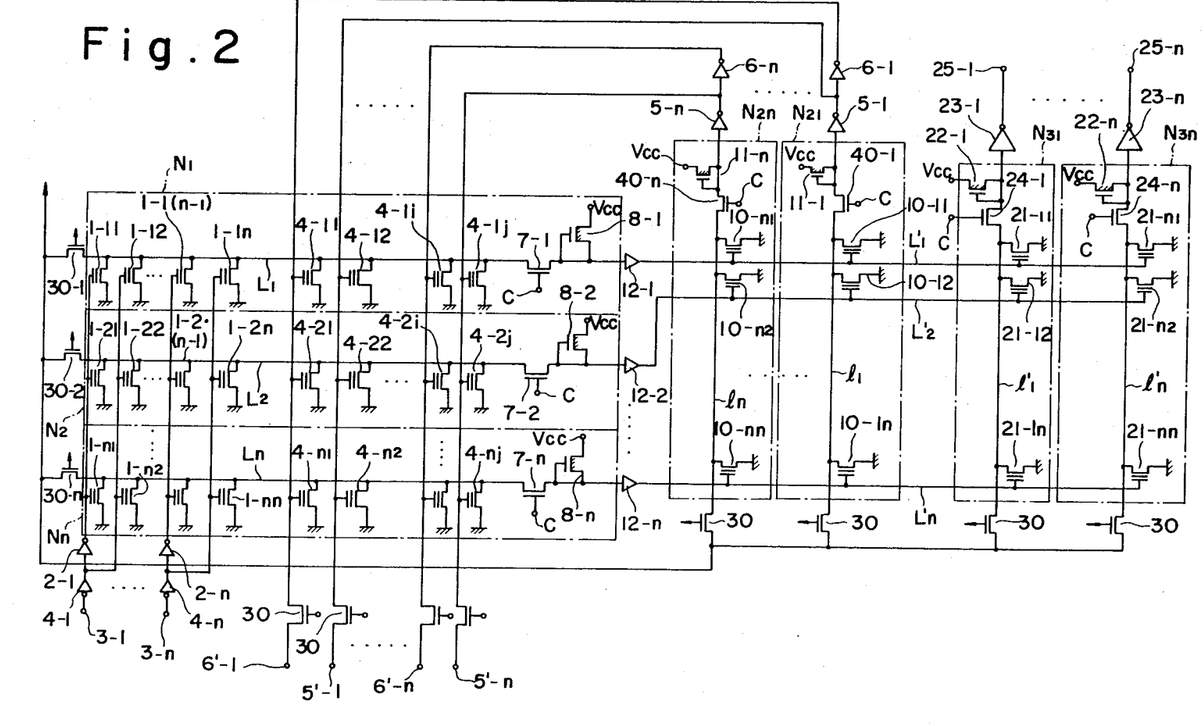
FIG. 2 is a circuit diagram showing the structure of an erasable FPLA constructed in accordance with one embodiment of the present invention.

FIG. 2 illustrates one embodiment of the erasable FPLA(EFPLA) constructed in accordance with the present invention, employing the stacked-gate memory cell. As shown, the EFPLA includes plural rows of multi-input NOR gates N1, N2, ..., and N$n$ ($n$ is a positive integer) which are all identical in structure. The row N1 includes a horizontal conductor L1 and a plurality of stacked-gate avalanche injection MOS (referred to as SAMOS hereinafter) transistor 1-11, 1-12, ..., and 1-1$n$ and 4-11, 4-12, ..., and 4-1$j$ whose drains are connected to the horizontal conductor L1 and whose sources are connected to ground. The odd-numbered SAMOS transistors 1-11, 1-13, ..., and 1-1($n$−1) have their control or stacked gates connected to the corresponding vertical conductors which are connected to the corresponding input terminals 3-1 through 3-$n$ through the corresponding serially connected inverter pairs 2-1 and 4-1 through 2-7 and 4-7, respectively. On the other hand, the even-numbered SAMOS transistors 1-12, 1-14, ..., and 1-1$n$ have their control or stacked gates connected to the corresponding vertical conductors which are connected to the corresponding input terminals 3-1 through 3-$n$ through the corresponding inverters 4-1 through 4-$n$, respectively.

The even-numbered SAMOS transistors 4-12, 4-14, ..., and 4-1$i$ ($i$: positive even integer) have their control gates connected to the vertical conductors which are connected to the outputs of inverters 5-1 through 5-$n$ whose inputs are connected to the respective vertical conductors l1 through l$n$ of NOR gates N21 through N2$n$. On the other hand, the odd-numbered SAMOS transistors 4-11, 4-13, . . . , and 4-1j (j: positive odd integer) have their control gates connected to the vertical conductors which are connected to the outputs of the corresponding inverters 5-1 through 5-n via the corresponding inverters 6-1 through 6-n. The vertical conductors connected to the even-numbered SAMOS transistors 4-12, 4-14, . . . , and 4-1i are also connected via respective MOS transistors 30 to program input terminals 5'-1 through 5'-n, respectively; whereas, the vertical conductors connected to the odd-numbered SAMOS transistors 4-11, 4-13, . . . , 4-1j are also connected via respective MOS transistors 30 to program input terminals 6'-1 through 6'-n, respectively. As will be described later, these program input terminals 5'-1 through 5'-n and 6'-1 through 6'-n are used only to program or deprogram selected ones of the jxn matrix SAMOS transistors to establish desired feedback loops.

The horizontal conductor L1 is connected to the input of a buffer amplifier 12-1 through a MOS transistor 7-1 whose gate is connected to a chip select terminal C. The MOS transistor 7-1 is turned off during writing and other than that it is kept conductive. Moreover the horizontal conductor L1 may be connected to a voltage source $V_{CC}$ through a driver MOS transistor 8-1.

Figure 3:
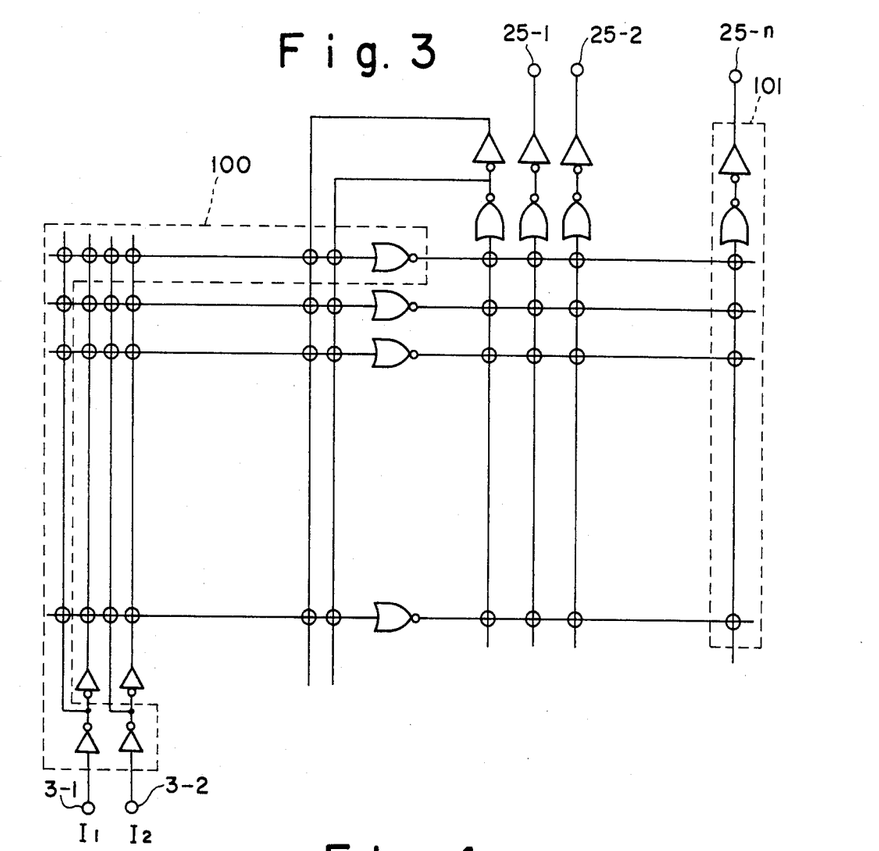
FIG. 3 is an equivalent circuit diagram of the circuit of FIG. 2 when illustrated using logic symbols.

The above-described NOR gate N1 together with the buffer amplifier 12-1 and the inverters 2-1 through 2-n forms an AND gate 100 having n input terminals, as shown in FIG. 3. Likewise, the remaining NOR gate Ni in combination with the corresponding buffer amplifier 12-i, where $2 \leq i \leq n$, and the inverters 2-1 through 2-n also forms an AND gate.

As shown in the right half of FIG. 2, a plurality of NOR gates N21 through N2n are provided. The NOR gate N21 includes a vertical conductor l1 and a plurality of SAMOS transistors 10-11, 10-12, . . . , and 10-1n which have their drains connected to the vertical conductor l1 and their sources connected to ground. The vertical conductor l1 is also connected to the input of the inverter 5-1 through a MOS transistor 40-1 which has its gate connected to a chip select terminal C and which is turned off only during the write-in mode. Another MOS transistor 11-1 is also connected between the power source $V_{CC}$ and the junction between the inverter 5-4 and the MOS transistor 40-1. The MOS transistor 11-1 has its gate connected to the vertical conductor l1. It is to be noted that the remaining NOR gates 5-i ($2 \leq i \leq n$) are similarly structured.

The horizontal conductor L1' extending to the right from the output of the buffer amplifier 12-1 is connected to the control gate of each of SAMOS transistors 10-11 through 10-n1 each belonging to the corresponding one of the NOR gates N21 through N2n. In like manner, the other horizontal conductor Li' extending to the right from the output of the corresponding buffer amplifier 12-i is also connected to the control gate of each of SAMOS transistors 10-1i through 10-ni each belonging to the corresponding one of the NOR gates N21 through N2n, where $2 \leq i \leq n$.

Another set of NOR gates N31 through N3n are provided, and, for example, the NOR gate N31 includes a vertical conductor l1' and a plurality of SAMOS transistors 21-11 through 21-1n which have their drains are all connected to the vertical conductor l1', their sources are all connected to ground and their gates connected to the corresponding horizontal conductors L1' through Ln', respectively. The vertical conductor l1' is connected to the input of an inverter 23-1 through a MOS transistor 24-1 which has its gate connected to the chip select terminal C to be turned on only during the writing mode. The vertical conductor l1' may be connected to the voltage source $V_{CC}$ through a depletion mode MOS transistor 22-1 whose gate is connected to the conductor l1'. The remaining NOR gate N3i, where $2 \leq i \leq n$, is similarly constructed. The output ends of the NOR gates N31 through N3n are connected to the corresponding output terminals 25-1 through 25-n, respectively, of the present EFPLA through the corresponding inverters 23-1 through 23-n.

It is to be noted that a plurality of MOS transistors 30 are appropriately provided as pass transistors and they are rendered conductive only during programming or reprogramming. The program input terminals 5'-1 through 5'-n and 6'-1 through 6'-n are connected to a programming or reprogramming control circuit (not shown). The terminals C are connected to a chip select circuit as is obvious for those skilled in the art.

Figure 4:
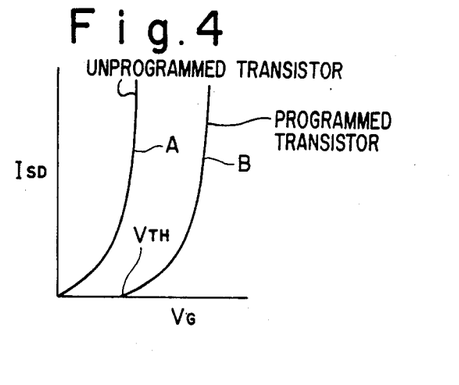
FIG. 4 is a graph showing the typical characteristics between the gate voltage $V_G$ and the source-drain current $I_{SD}$ of a SAMOS when programmed and unprogrammed.

FIG. 3 is a schematic illustration which is structurally equivalent to the circuit diagram of FIG. 2. In FIG. 3, each of the intersections of the matrix of vertically and horizontally running conductors is indicated by a circle which corresponds to one of the SAMOS transistors 1, 4, 10 and 21 in FIG. 2. The characteristics between the gate voltage $V_G$ and the source-drain current $I_{SD}$ of the SAMOS transistor employed in the circuit of FIG. 2 are shown in FIG. 4. The curve A is the case when the SAMOS transistor is unprogrammed; whereas, the curve B shows the characteristic when the SAMOS transistor is programmed and its threshold voltage $V_{TH}$ is increased because of injection of hot electrons into its floating electrode.

Referring back to FIG. 2, as a very simple example, if it is desired to obtain a NAND output at the output terminal 25-n by using only the two input terminals 3-1 and 3-n, then SAMOS transistors 1-11, 1-2(n−1), 21-n1 and 21-n2 should be left unprogrammed (curve A in FIG. 4) and all of the other SAMOS transistors should be programmed (curve B in FIG. 4). Moreover, MOS transistors 7-1 and 24-n must be turned on.

Under the circumstances, if no input signal is supplied to input terminals 3-1 and 3-n, the outputs from the inverters 2-1 and 2-n are both "0", so that SAMOS transistors 1-11 and 1-2(n−1) are nonconductive. This causes the horizontal conductor L1 to be i the "1" state, which then renders SAMOS transistor 21-n1 conductive. As a result, the vertical conductor ln' is pulled down to "0", so that the inverter 23-n supplies its output "1" to output terminal 25-n.

When both of input terminals 3-1 and 3-n receive "1" at the same time, the inverters 2-1 and 2-n supply "1" as their outputs, so that SAMOS transistors 1-11 and 1-2(n−1) are both turned on to pull down the horizontal conductor L1 to the 37 0" state thereby causing SAMOS transistor 21-n1 turned off. Thus, the inverter 23-n receives "1" as its input and supplies "0" to output terminal 25-n.

If either one of input terminals 3-1 and 3-n receives "0", then that SAMOS transistor 1-11 or 1-2(n−1) which corresponds to the input terminal which have received "0" is turned off. Accordingly, either one of horizontal conductors L1 and L2 becomes "0" and the other becomes "1" so that either one of SAMOS transistors 21-n1 and 21-n2 is rendered conductive with the other rendered nonconductive. As a result, the vertical conductor ln' is pulled down to "0" which then causes inverter 23-n to supply output signal "1" to output terminal 25-n.

Alternatively, if it is desired to obtain an OR output at output terminal 25-n, it is only necessary to leave SAMOS transistors 1-12, 1-2n, 21-n1 and 21-n2 unprogrammed with the other SAMOS transistors all programmed.

Figure 5A:
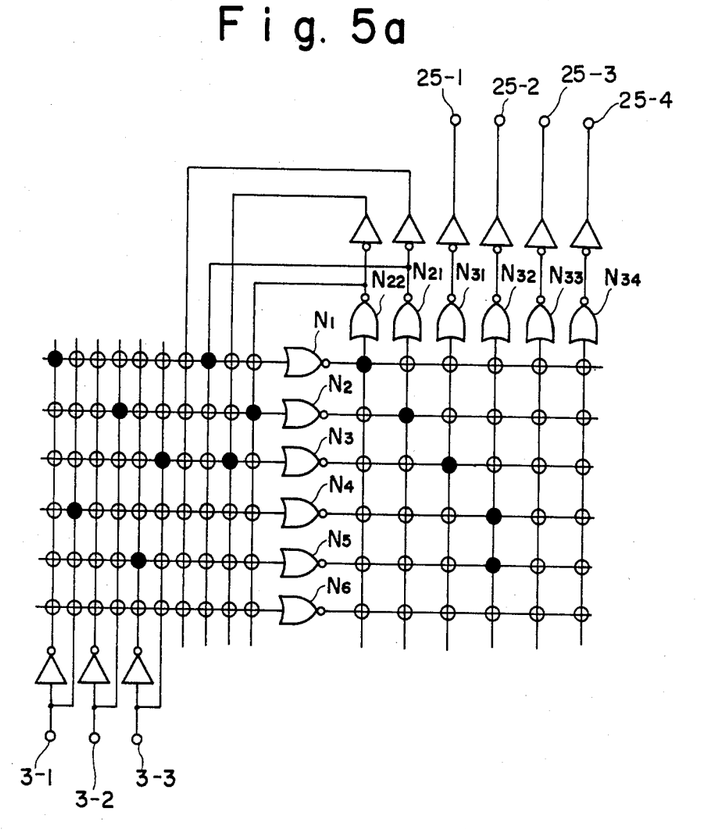
FIG. 5a is a schematic illustration of one embodiment of the present FPLA when the desired logic function is programmed.
Figure 5B:
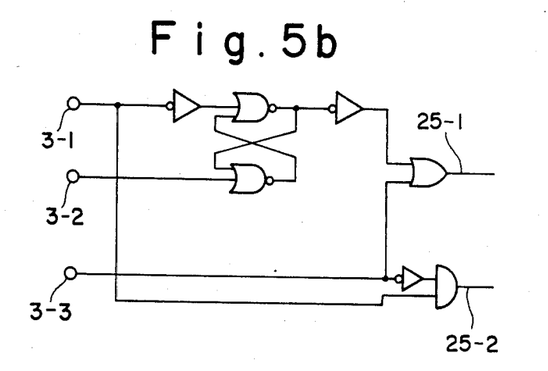

FIG. 5a illustrates one example of the present EFPLA which has been programmed to establish the logic circuit shown in FIG. 5b. In FIG. 5a, the black dots indicate that the corresponding SAMOS transistors are unprogrammed to possess the characteristic A of FIG. 4; on the other hand, the white dots indicate that the corresponding SAMOS transistors are programmed to possess the characteristic B of FIG. 4. To program one of SAMOS transistors, say SAMOS transistor 1-1n, MOS transistor 30-1 is turned on to select the horizontal conductor L1 and a relatively high programming voltage of 21 V (compared with the read voltage of 5 V) is applied to the input terminal 3-n, so that hot electrons are injected into the floating gate of SAMOS transistor 1-1n and thus its threshold voltage becomes larger than the read voltage. In this manner, one or more of the SAMOS transistors may be selectively programmed. On the other hand, in order to erase the program stored in the present device, use may be made of ultraviolet light. Thereafter, the device may be reprogrammed. It is also to be noted that since the combinational logic circuit of FIG. 5b is the sequential type, the feedback loops from the OR-plane to the AND-plane are used in the structure of FIG. 5a.

Figure 6:
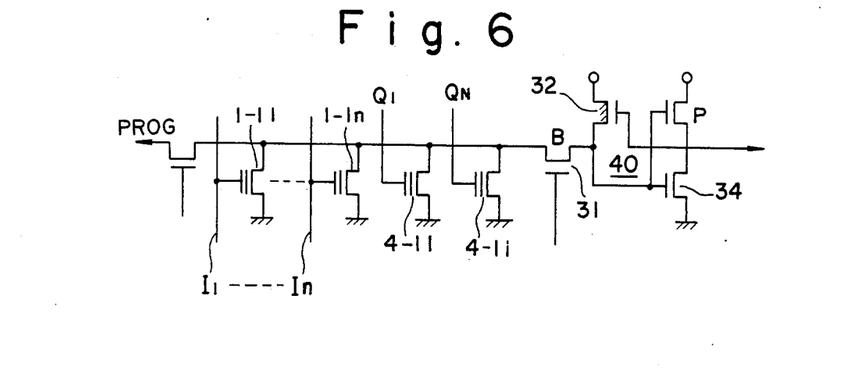
FIGS. 6 through 8 show various modifications of the present erasable FPLA.

FIG. 6 shows another embodiment of the present invention in which the CMOS structure is used as an output circuit of NOR gate N1. It is to be noted that like reference characters indicate like elements shown in FIG. 2 and description will not be repeated. Although not shown specifically in FIG. 6, the gate of MOS transistor 31 receives an AND output between input signals I1 through In, which are also supplied to SAMOS transistors 1-11 through 1-1n, respectively, and input signals Q1 through Qi, which are also supplied to SAMOS transistors 4-11 through 4-1i, respectively. Thus, if one of the input signals is at the low level, the MOS transistor 31 is in the nonconducting state. Therefore the current from MOS transistor 32 causes NMOS transistor 34 of flipflop 40 to be on so that the output becomes low.

Figure 7:
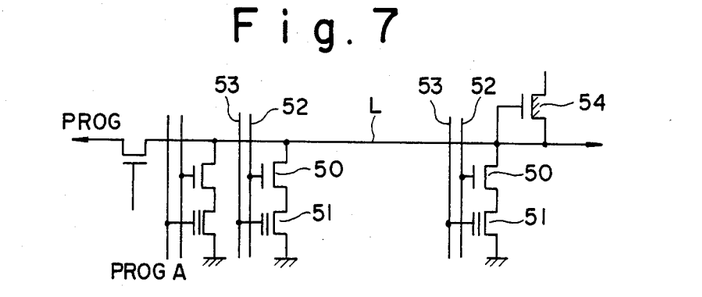

FIG. 7 shows a further modification of the present invention in which use is made of an electrically erasable SAMOS as a memory element. As shown, a MOS transistor 50 and an electrically erasable SAMOS 51 are connected in series between the horizontal conductor L and ground. Each of the MOS transistors 50 has its gate connected to the corresponding select line 52; whereas, each of the SAMOS transistors 51 has its gate connected to the corresponding program line 53. During write mode, the selected program line receives a high positive voltage and the select line 52 corresponding to the selected MOS transistor 50 is also set at high level. On the other hand, during erase mode, a negative voltage is applied to the program line. It is to be noted that MOS transistor 54 is provided as a load.

Figure 8:
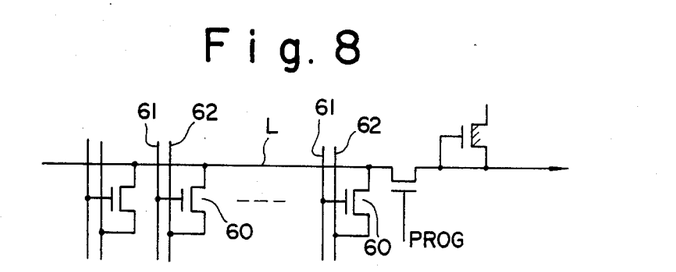

FIG. 8 shows a further modification of the present invention in which use is made of MNOS (Metal Nitride Oxide Semiconductor) transistor as a memory element. Each of the MNOS transistors 60 has its gate connected to the corresponding select line 61, its drain connected to the corresponding program and its source connected to the horizontal conductor L. During programming, "0" (or "1") is applied to the selected program line 62 with "1" applied to the selected select line 61; on the other hand, during deprogramming, "1" (or "0") is applied to the selected program line 62 with "1" applied to the selected select line 61.

It should be noted that other reprogrammable memory elements such as FAMOS (Floating Gate Avelanche Injection MOS) may also be used in the present invention. In this manner, in the present PLA, reprogrammable or semipermanently alterable memory elements are used in the form of a matrix, so that the same PLA may be used to store different logic functions by reprogramming.

Figure 9:
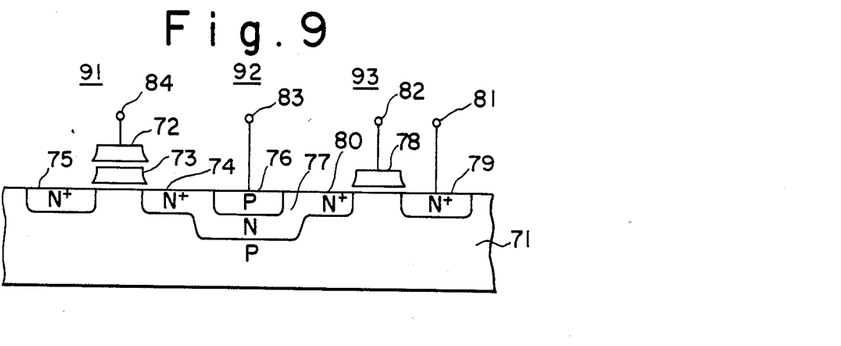
FIG. 9 is a cross-sectional view schematically showing the structure of a semiconductor device constructed in accordance with one embodiment of the present invention.

FIG. 9 shows the structure of a memory cell having a high driving capability, which may be advantageously used in an EFPLA. As shown, the structure of FIG. 9 includes a SAMOS transistor 91, a PNP bipolar transistor 92 and a N-channel MOS transistor 93 in the surface of a P type single crystal silicon substrate 71. The SAMOS transistor 91 includes a polysilicon control gate 72, a polysilicon floating gate 73 provided as buried in an insulating material to be electrically isolated from the control gate 72 and also from the substrate 71, and drain and source regions 74, 75 which are defined by N+ diffused regions formed in the substrate 71. The PNP transistor 92 has a vertical structure and it is comprised of an emitter 76 of P type diffused region, a base 77 of N type diffused region and a collector 71 of P type substrate 71. It is to be noted that the drain region 74 of the SAMOS transistor 91 has an overlapping diffusion region with the base 77 of the NPN transistor 92. The NMOS transistor 3 is to be used for controlling the programming or reprogramming operation and it includes a control gate 78, which is electrically isolated from the substrate 71 by means of an insulating material such as $SiO_2$, and drain and source regions 79, 80. It is to be noted that the source region 80 of the MOS transistor 93 has an overlapping diffusion region which is shared by a portion of the base 77 of the PNP transistor 92.

Figure 10:
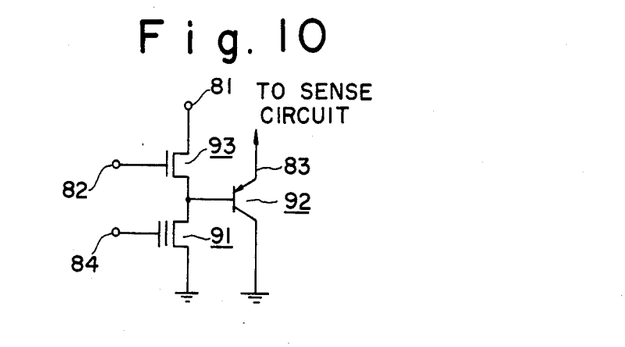
FIG. 10 is an equivalent circuit diagram of the structure of FIG. 9.

Also provided is a program terminal 81 through which a high voltage is applied to the drain region 79 of NMOS transistor 93 during the programming operation. The reference numeral 12 indicates an input terminal connected to the gate 78 of NMOS transistor 93. The emitter 76 of PNP transistor 92 is connected to a terminal 83, which, in turn, is connected to a sense amplifier (not shown). The reference numeral 84 indicates an input terminal through which a high voltage may be applied to the control gate 72 of SAMOS transistor 91. FIG. 10 shows an equivalent circuit of the structure shown in FIG. 9.

In operation, to program the SAMOS transistor 91, a high voltage, say 21 V, is applied to the control gate 72 of SAMOS transistor 91 and also the program control gate 78 of NMOS transistor 93 with the high voltage also applied to the drain region 79 of NMOS transistor 93. The high voltage applied to the drain region 79 is also applied to the drain region 74 of SAMOS transistor 91 through the channel of NMOS transistor 93 and the base 77 of PNP transistor 92. As a result, hot electrons are injected into the floating gate 73 of SAMOS transistor 91 from the drain region 74 so that the floating gate 73 becomes charged and the threshold voltage of SAMOS transistor 91 is increased.

As described previously, the SAMOS transistor 91 has the gate voltage $V_G$ to source-drain current $I_{SP}$ characteristic indicated by the curve A when the SAMOS transistor 91 is unprogrammed and its floating gate 73 is not charged. On the other hand, once the SAMOS transistor 91 is programmed and its floating gate 73 is charged, the $V_G$ to $I_{SD}$ characteristic is shifted to curve B which has an increased threshold voltage $V_{TH}$. Thus, when a read voltage between the threshold voltage of curve A and the threshold voltage of curve B is applied to the control gate 72, the SAMOS transistor 91 is rendered conductive if it is programmed and it is rendered nonconductive if it is unprogrammed.

Accordingly, in the case where the SAMOS transistor 91 is unprogrammed, the application of the read voltage to the control gate 72 renders the SAMOS transistor 91 conductive, so that the base current of PNP transistor 92 flows from the emitter 76 to the drain region 74 of SAMOS transistor 91 via the base 77 and further to the source region 75 of SAMOS transistor 91. Thus, in the PNP transistor 92, the emitter current multiplied by $h_{FE}$ flows from the emitter 76 to the collector, or the substrate 71 via the base 77. As a result, a sense amplifier (not shown) connected to the terminal 83 of the EFPLA will sense "1" or the unprogrammed state.

On the other hand, in the case where the SAMOS transistor 91 is programmed, it is in the nonconducting state so that the PNP transistor 83 is rendered nonconductive and no emitter current flows thereby the "0" state or programmed state is sensed by the sense amplifier. The SAMOS transistor 91 may be converted from the programmed state into the unprogrammed state by irradiating the floating gate 73 with ultraviolet light. With such irradiation, the charges stored in the floating gate 73 absorb energy from ultraviolet light and a photoelectric current results which takes the gate electrons back to the substrate thereby the SAMOS transistor 91 is restored to the initial unprogrammed condition.

Figure 11:
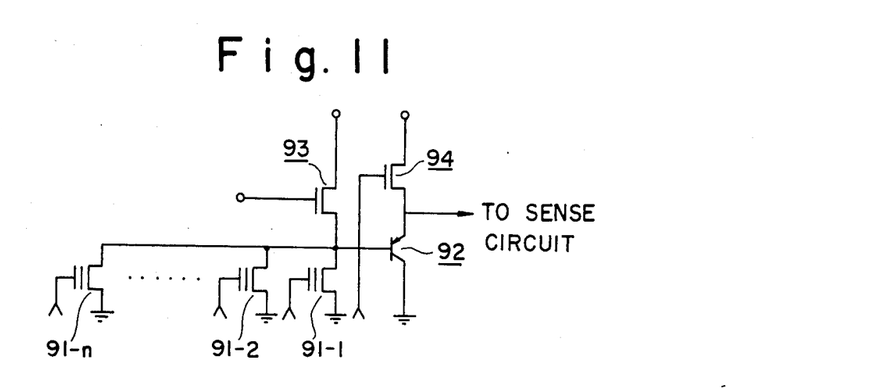
FIG. 11 is a circuit diagram showing when the circuit of FIG. 10 is applied to an erasable FPLA.

FIG. 11 shows a circuit diagram in which the above-described structure is employed in an EFPLA to form a NOR gate. As shown, to the base of the bipolar transistor 92 are connected in parallel a plurality of SAMOS transistors 91-1 through 91-n. It is to be noted that the drain region of each of the SAMOS transistors 91-1 through 91-n has an overlapping portion which is shared by a part of the base of the bipolar transistor 92. Similarly with the structure shown in FIG. 9, the NMOS transistor 93 for controlling programming is connected to the base of NPN transistor 92. Also provided is a select MOS transistor 94 which is operated to set the desired NOR gate in the selected state.

It is to be noted that other reprogrammable memory elements such as FAMOS and MNOS transistors may also be used in place of the SAMOS transistor 91 as is obvious for those skilled in the art.

As described in detail above, in accordance with the present invention, the source/drain region of a reprogrammable semiconductor nonvolatile memory element is constructed to share a part of the diffusion region with the base of a bipolar transistor in the same substrate. As a result, the current level of a SAMOS transistor (tens of microampers, e.g., 60 microampers) can be converted into the current level of a bipolar transistor (typically, 1,2 mA). In this manner, since the current level is significantly increased, typically by 20 times, the present invention allows to obtain a high speed operation with the operating speed of 20-30 nanoseconds instead of approximately 400 nanoseconds without using the novel structure of the present invention.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A programmable logic array in which a desired logic function may be erasably programmed comprising:
   a plurality of input terminals;
   an AND plane including a plurality of AND gates each of which is operatively connected to receive a signal from the corresponding one of said plurality of input terminals; and
   an OR plane including a plurality of OR gates each of which is operatively connected to receive a signal from the corresponding one of said plurality of AND gates in said AND plane and to supply a logic output, wherein at least one of said AND and OR planes includes:
   a matrix of conductors including first and second conductors which run in different directions thereby defining intersections therebetween and which are electrically isolated from one another; and
   a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage.

2. A programmable logic array in which a desired logic function may be erasably programmed comprising:
   a plurality of input terminals;
   an AND plane including a plurality of AND gates each of which is operatively connected to receive a signal from the corresponding one of said plurality of input terminals; and wherein said AND plane includes:
   a matrix of conductors including first and second conductors which run in different directions thereby defining intersections therebetween and which are electrically isolated from one another; and
   a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage.

3. A programmable logic array in which a desired logic function may be erasably programmed comprising:
   a plurality of input terminals;
   an OR plane including a plurality of OR gates each of which is operatively connected to receive a signal from the corresponding one of said plurality of input terminals and to supply a logic output, wherein said OR plane includes:
   matrix of conductors including first and second conductors which run in different directions thereby defining intersections therebetween and which are electrically isolated from one another; and a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage.

4. A programmable logic array in which a desired logic function may be erasably programmed comprising:

a matrix of conductors including a first plurality of conductors and a second plurality of conductors extending in the direction normal to and electrically isolated from said first conductors;

a plurality of input terminals connected to said matrix;

a plurality of output terminals connected to said matrix;

a plurality of reprogrammable memory elements each disposed at the cross-over point between said first and second pluralities of conductors, each of said reprogrammable memory elements disposed in said matrix having its first electrode connected to the corresponding first conductor, its second electrode connected to the corresponding second conductor and its third electrode connected to a reference voltage;

wherein each conductor is one of said first and second pluralities of conductors and the reprogrammable memory elements associated therewith form one gate of said logic function.

5. A programmable logic array according to claim 4 wherein said logic function is the AND function.

6. A programmable logic array according to claim 4 wherein said logic function is the OR function.

7. A programmable logic array in which a desired logic function may be erasably programmed comprising:

a matrix of conductors including a plurality of horizontal conductors which may be selectively connected to a first reference voltage and a plurality of vertical conductors extending in the direction normal to and electrically isolated from said horizontal conductors;

a plurality of input terminals each of which is connected to supply one binary state to the corresponding one of said vertical conductors of said matrix and the other binary state to the other corresponding one of said vertical conductors of said matrix;

a plurality of output terminals connected to receive output signals from the horizontal conductors of said matrix;

a plurality of reprogrammable memory elements each disposed at the cross-over point between said horizontal and vertical conductors, each of said reprogrammable memory elements disposed in said matrix having its first electrode connected to the corresponding vertical conductor, its second electrode connected to the corresponding horizontal conductor and its third electrode connected to a reference voltage;

wherein each horizontal conductor and the programmable memory elements associated therewith form one gate of said logic function.

8. A programmable logic array according to claim 7 wherein said logic function is the AND function.

9. A programmable logic array in which a desired logic function may be erasably programmed comprising:

a matrix of conductors including a plurality of horizontal conductors and a plurality of vertical conductors extending in the direction normal to and electrically isolated from said horizontal conductors of said matrix;

a plurality of input terminals connected to said horizontal conductors;

output terminals connected to receive output signals from the vertical conductors of said matrix;

a plurality of reprogrammable memory elements each disposed at the cross-over point between said horizontal and vertical conductors, each of said reprogrammable memory elements disposed in said matrix having its first electrode connected to the corresponding horizontal conductor, its second electrode connected to the corresponding vertical conductor and its third electrode connected to a reference voltage;

wherein each vertical conductor and the programmable memory elements associated therewith form one gate of said logic function.

10. A programmable logic array according to claim 9 wherein said logic function is the OR function.

11. A programmable logic array according to claim 1, further comprising:

means for applying a predetermined potential to said first conductors.

12. A programmable logic array according to claim 11, wherein said predetermined potential is a supply voltage.

13. A programmable logic array according to claim 12 wherein said means for applying includes at least one MOSFET having a first drain/source connected to said supply voltage, a second drain/source connected to a corresponding one of said first conductors and a gate connected to said corresponding one of said first conductors.

14. A programmable logic array according to claim 13, wherein said MOSFET is a depletion-mode MOSFET.

15. A programmable logic array according to claim 2, further comprising:

means for applying a predetermined potential to said first conductors.

16. A programmable logic array according to claim 15, wherein said predetermined potential is a supply voltage.

17. A programmable logic array according to claim 16 wherein said means for applying includes at least one MOSFET having a first drain/source connected to said supply voltage, a second drain/source connected to a corresponding one of said first conductors and a gate connected to said corresponding one of said first conductors.

18. A programmable logic array according to claim 17, wherein said MOSFET is a depletion-mode MOSFET.

19. A programmable logic array according to claim 3, further comprising:

means for applying a predetermined potential to said first conductors.

20. A programmable logic array according to claim 19, wherein said predetermined potential is a supply voltage.

21. A programmable logic array according to claim 20 wherein said means for applying includes at least one MOSFET having a first drain/source connected to said supply voltage, a second drain/source connected to a corresponding one of said first conductors and a gate connected to said corresponding one of said first conductors.

22. A programmable logic array according to claim 21, wherein said MOSFET is a depletion mode MOSFET.

23. A programmable logic array according to claim 4, further comprising:
means for applying a predetermined potential to said first plurality of conductors.

24. A programmable logic array according to claim 23, wherein said predetermined potential is a supply voltage.

25. A programmable logic array according to claim 24 wherein said means for applying includes at least one MOSFET having a first drain/source connected to said supply voltage, a second drain/source connected to a corresponding one of said first plurality of conductors and a gate connected to said corresponding one of said first plurality of conductors.

26. A programmable logic array according to claim 25, wherein said MOSFET is a depletion-mode MOSFET.

27. A programmable logic array according to claim 7, further comprising:
means for applying a predetermined potential to said horizontal conductors.

28. A programmable logic array according to claim 27 wherein said predetermined potential is a supply voltage.

29. A programmable logic array according to claim 28 wherein said means for applying includes at least one MOSFET having a first drain/source connected to said supply voltage, a second drain/source connected to a corresponding one of said horizontal conductors and a gate connected to said corresponding one of said horizontal conductors.

30. A programmable logic array according to claim 29, wherein said MOSFET is a depletion-mode MOSFET.

31. A programmable logic array according to claim 9, further comprising:
means for applying a predetermined potential to said horizontal conductors.

32. A programmable logic array according to claim 31, wherein said predetermined potential is a supply voltage.

33. A programmable logic array according to claim 32 wherein said means for applying includes at least one MOSFET having a first drain/source connected to said supply voltage, a second drain source connected to a corresponding one of said horizontal conductors and a gate connected to said corresponding one of said horizontal conductors.

34. A programmable logic array according to claim 33, wherein said MOSFET is a depletion-mode MOSFET.

* * * * *

REEXAMINATION CERTIFICATE (1239th)
United States Patent
[11] B1 4,617,649

Kyomasu et al.

[45] Certificate Issued  Apr. 3, 1990

[54] ERASABLE FPLA

[75] Inventors: Mikio Kyomasu; Toshiyuki Araki, both of Toyono; Shinobu Fukunaga, Kawanishi; Masahiro Shindo, Toyonaka, all of Japan

[73] Assignee: Ricoh Company, Ltd., Tokyo, Japan

Reexamination Request:
No. 90/001,719, Feb. 22, 1989

Reexamination Certificate for:
Patent No.: 4,617,649
Issued: Oct. 14, 1986
Appl. No.: 689,703
Filed: Jan. 7, 1985

Related U.S. Application Data

[63] Continuation of Ser. No. 442,167, Nov. 16, 1982, Pat. No. 4,503,520.

[30] Foreign Application Priority Data

Nov. 17, 1981 [JP] Japan ................................ 56-185037

[51] Int. Cl.⁴ .............................................. G11C 13/00
[52] U.S. Cl. ............................... 365/189.01; 365/104; 307/465; 307/468

[56] References Cited

U.S. PATENT DOCUMENTS 4,041,459  8/1977  Horninger.
4,091,359  5/1978  Rossler.

OTHER PUBLICATIONS

IBM Technical Disclosure Bulletin, vol. 22, No. 10, Mar. 1980, pp. 4621–4622, "Electrically Programmable Logic Array", by D. G. Grice.
Japanese Patent Application Laying Open (KOKAI) No. 52-101910.
Japanese Patent Application Laying Open (KOKAI) No. 54-72833, and English translation.
Japanese Patent Application Laying Open (KOKAI) No. 55-140331, and English translation.

*Primary Examiner*—Terrell W. Fears
*Attorney, Agent, or Firm*—Oblon, Spivak, McClelland, Maier & Neustadt

[57] ABSTRACT

An erasable field programmable logic array including a matrix of reprogrammable memory elements which may be selectively programmed to store a desired logic function therein is provided. Since use is made of reprogrammable memory elements, the stored logic function may be erased and another logic function may be programmed into the programmable logic array.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-7, 9-11, 15, 19, 23-27 and 31-34 are cancelled.

Claims 8, 12, 16, 20, 21 and 28 are determined to be patentable as amended.

Claims 13, 14, 17, 18, 22, 29 and 30, dependent on an amended claim, are determined to be patentable.

New claims 35-55 are added and determined to be patentable.

8. A programmable logic array according to claim [7] *53*, wherein said logic function is the AND function.

12. A programmable logic array according to claim [11] *35*, wherein said predetermined potential is a supply voltage.

16. A programable logic array according to claim [15] *41*, wherein said predetermined potential is a supply voltage.

20. A programmable logic array according to claim [19] *47*, wherein said predetermined potential is a supply voltage.

21. A programmable logic array according to claim 20 wherein said means for applying includes at least one MOSFET having a first drain/source connected to said supply voltage, a second drain/source connected to a corresponding one of said [first] *second* conductors and a gate connected to said corresponding one of said [first] *second* conductors.

28. A programmable logic array according to claim [27] *53*, wherein said predetermined potential is a supply voltage.

*35. A programmable logic array in which a desired logic function may be erasably programmed comprising:*
  *a plurality of input terminals;*
  *an AND plane including a plurality of AND gates each of which is operatively connected to receive a signal from the corresponding one of said plurality of input terminals; and*
  *an OR plane including a plurality of OR gates each of which is operatively connected to receive a signal from the corresponding one of said plurality of AND gates in said AND plane through buffer amplifiers, wherein at least one of said AND and OR planes includes:*
  *a matrix of conductors including first and second conductors which run in different directions thereby defining intersections therebetween and which are electrically isolated from one another;*
  *a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage;*
  *means for applying a predetermined potential to said first conductors; and*
  *switching means connected to said first conductors and being nonconductive upon reprogramming said reprogrammable memory elements.*

*36. A programmable logic array according to claim 35, wherein said means for applying is connected to said first conductors through said switching means.*

*37. A programmable logic array according to claim 35, wherein said switching means comprise MOSFET.*

*38. A programmable logic array according to claim 35, further comprising pass transistors connected to said first and second conductors and being conductive upon reprogramming said reprogrammable memory elements.*

*39. A programmable logic array according to claim 35, wherein each of said reprogrammable memory elements is a SAMOS.*

*40. A programmable logic array according to claim 35, wherein each of said reprogrammable memory elements is a MNOS.*

*41. A programmable logic array in which a desired logic function may be erasably programmed comprising:*
  *a plurality of input terminals;*
  *an AND plane including a plurality of AND gates each of which is operatively connected to receive a signal from the corresponding one of said plurality of input terminals; and*
  *an OR plane including a plurality of OR gates each of which is operatively connected to receive a signal from the corresponding one of said plurality of AND gates in said AND plane through buffer amplifiers, wherein said AND plane includes:*
  *a matrix of conductors including first and second conductors which run in different directions thereby defining intersections therebetween and which are electrically isolated from one another;*
  *a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage;*
  *means for applying a predetermined potential to said first conductors; and*
  *switching means connected to said first conductors and being nonconductive upon reprogramming said reprogrammable memory elements.*

*42. A programmable logic array according to claim 41, wherein said means for applying is connected to said first conductors through said switching means.*

*43. A programmable logic array according to claim 41, wherein said switching means comprises MOSFET.*

*44. A programmable logic array according to claim 41, further comprising pass transistors connected to said first and second conductors and being conductive upon reprogramming said reprogrammable memory elements.*

*45. A programmable logic array according to claim 41, wherein each of said reprogrammable memory elements is a SAMOS.*

46. A programmable logic array according to claim 41, wherein each of said reprogrammable memory elements is a MNOS.

47. A programmable logic array in which a desired logic function may be erasably programmed comprising:
   a plurality of input terminals;
   an AND plane including a plurality of AND gates each of which is operatively connected to receive a signal from the corresponding one of said plurality of input terminals; and
   an OR plane including a plurality of OR gates each of which is operatively connected to receive a signal from the corresponding one of said plurality of AND gates in said AND plane through buffer amplifiers, wherein said OR plane includes;
   a matrix of conductors including first and second conductors which run in different directions thereby defining intersections therebetween and which are electrically isolated from one another;
   a plurality of reprogrammable memory elements each disposed at each of the intersections between said first and second conductors, each of said reprogrammable memory elements having a first electrode connected to the corresponding one of said first conductors, a second electrode connected to the corresponding one of said second conductors and a third electrode connected to a reference voltage;
   means for applying a predetermined potential to said second conductors; and
   switching means connected to said first conductors and being nonconductive upon reprogramming said reprogrammable memory elements.

48. A programmable logic array according to claim 47, wherein said means for applying is connected to said second conductors through said switching means.

49. A programmable logic array according to claim 47, wherein said switching means comprises MOSFET.

50. A programmable logic array according to claim 47, further comprising pass transistors connected to said first and second conductors and being conductive upon reprogramming said reprogrammable memory elements.

51. A programmable logic array according to claim 47, wherein each of said reprogrammable memory elements is a SAMOS.

52. A programmable logic array according to claim 47, wherein each of said reprogrammable memory elements is a MNOS.

53. A programmable logic array in which a desired logic function may be erasably programmed comprising:
   a matrix of conductors including a plurality of horizontal conductors and a plurality of vertical conductors extending in the direction normal to and electrically isolated from said horizontal conductors;
   a plurality of input terminals each of which is connected to supply one binary state to the corresponding one of said vertical conductors of said matrix and the other binary state to the other corresponding one of said vertical conductors of said matrix;
   a plurality of output terminals connected to receive output signals from the horizontal conductors of said matrix;
   a plurality of reprogrammable memory elements each disposed at the cross-over point between said horizontal and vertical pluralities of conductors, each of said reprogrammable memory elements disposed in said matrix having its first electrode connected to the corresponding horizontal conductor, its second electrode connected to the corresponding vertical conductor and its third electrode connected to a reference voltage; and
   means for applying a predetermined potential to said horizontal conductors.

54. A programmable logic array according to claim 53, wherein each of said reprogrammable memory elements is a SAMOS.

55. A programmable logic array according to claim 53, wherein each of said reprogrammable memory elements is a MNOS.

* * * * *